United States Patent
Song et al.

(10) Patent No.: US 10,014,348 B2
(45) Date of Patent: Jul. 3, 2018

(54) ARTIFICIAL NEURON SEMICONDUCTOR ELEMENT HAVING THREE-DIMENSIONAL STRUCTURE AND ARTIFICIAL NEURON SEMICONDUCTOR SYSTEM USING SAME

(71) Applicants: Industry-University Cooperation Foundation Hanyang University, Seoul (KR); INDUSTRY-ACADEMIC COOPERATION FOUNDATION, YONSEI UNIVERSITY, Seoul (KR)

(72) Inventors: Yun Heub Song, Seongnam-si (KR); Hong Sik Jeong, Seongnam--si (KR)

(73) Assignees: Industry-University Cooperation Foundation Hanyang University, Seoul (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/488,816

(22) Filed: Apr. 17, 2017

(65) Prior Publication Data
US 2017/0221966 A1    Aug. 3, 2017

Related U.S. Application Data (63) Continuation-in-part of application No. PCT/KR2015/011015, filed on Oct. 19, 2015.

(30) Foreign Application Priority Data

Oct. 17, 2014    (KR) .................. 10-2014-0141003

(51) Int. Cl.
*H01L 45/00* (2006.01)
*H01L 27/24* (2006.01)
*G06N 3/04* (2006.01)

(52) U.S. Cl.
CPC .......... *H01L 27/2481* (2013.01); *G06N 3/04* (2013.01); *H01L 45/065* (2013.01); *H01L 45/1233* (2013.01); *H01L 45/141* (2013.01); *H01L 45/1608* (2013.01)

(58) Field of Classification Search
CPC ....... H01L 45/06; H01L 45/065; H01L 45/04; H01L 45/08; H01L 45/1233; H01L 45/141
See application file for complete search history.

(56) References Cited

U.S. PATENT DOCUMENTS

| | | | |
|---|---|---|---|
| 5,583,360 A | 12/1996 | Roth et al. | |
| 9,627,443 B2 * | 4/2017 | Jo | ........ H01L 45/1226 |
| 2010/0277232 A1 | 11/2010 | Snider | |
| 2012/0001654 A1 | 1/2012 | Strukov et al. | |
| 2012/0284218 A1 | 11/2012 | Kang et al. | |
| 2012/0330873 A1 | 12/2012 | Suri et al. | |
| 2017/0193365 A1 * | 7/2017 | Park | ........ H01L 27/24 |

* cited by examiner

*Primary Examiner* — Cuong Q Nguyen
(74) *Attorney, Agent, or Firm* — Sughrue Mion, PLLC

(57) ABSTRACT

An artificial neuron semiconductor device having a three-dimensional structure includes a first electrode to which a clock signal is applied, a second electrode in which an output signal is generated, an insulation column, a plurality of electrode layers for receiving an electrical signal from at least one synapse circuit, and a phase change layer which is divided into at least two parts by the insulation column and is in contact with at least two side surfaces of the insulation column, and the phase change layer is phase-changed by the plurality of electrode layers.

14 Claims, 9 Drawing Sheets

ARTIFICIAL NEURON SEMICONDUCTOR ELEMENT HAVING THREE-DIMENSIONAL STRUCTURE AND ARTIFICIAL NEURON SEMICONDUCTOR SYSTEM USING SAME

TECHNICAL FIELD

The present invention relates to an artificial neuron semiconductor device that is modeled on a soma of a neuron network system to have a three-dimensional structure and an artificial neuron semiconductor system, and more particularly, to a technology for modeling a phase change material on the soma and for modeling a plurality of electrode layers connected to the phase change material to have the three-dimensional structure on dendrites.

BACKGROUND ART

A technology for modeling a neuron network system simulates a biological neuron network system such that a digital neuron network computer is constituted by an electronic circuit functioning similar to a brain. However, since a soma of the neuron network system has an attribute value that is being changed, there are many difficulties in modeling the electronic circuit on the soma.

In particular, in a conventional technology for modeling the neuron network system, a synapse is modeled as a phase-change memory (PCM) and a resistive RAM (RRAM) and the soma is modeled as a silicon transistor (Si-transistor), and thus a power consumption increases and an integration becomes difficult.

Accordingly, a technology for modeling a phase change layer on the soma and a plurality of electrode layers on dendrites is suggested in the present disclosure.

DETAILED DESCRIPTION OF THE INVENTION

Technical Problem

The present invention provides an artificial neuron semiconductor device having a three-dimensional structure, in which a phase change layer is modeled on a soma and a plurality of electrode layers connected to the phase change layer in the three-dimensional structure is modeled on dendrites, and an artificial neuron semiconductor system having a three-dimensional structure in order to solve a power consumption and an integration problem.

Particularly, the present invention provides an artificial neuron semiconductor device having a three-dimensional structure, which is modeled on a neuron spiking by forming the phase change layer with a chalcogenide, and an artificial neuron semiconductor system having a three-dimensional structure.

Technical Solution

An artificial neuron semiconductor device having a three-dimensional structure includes a first electrode to which a clock signal is applied, a second electrode in which an output signal is generated, an insulation column, a plurality of electrode layers for receiving an electrical signal from at least one synapse circuit, and a phase change layer which is divided into at least two parts by the insulation column and is in contact with at least two side surfaces of the insulation column, and the phase change layer is phase-changed by the plurality of electrode layers.

The at least two parts of the phase change layer are connected to each other in an area under the insulation column.

The phase change layer is formed of a chalcogenide.

The phase change layer is crystallized based on the electrical signal received through each of the electrode layers.

The crystallized phase change layer generates the output signal to the second electrode in response to the clock signal applied thereto through the first electrode.

The electrode layers are connected to the phase change layer in a vertical direction to have the three-dimensional structure.

An artificial neuron semiconductor system having a three-dimensional structure includes a soma device and a plurality of synapse devices connected to the soma device. Each of the soma device and the synapse devices includes a first electrode to which a clock signal is applied, a second electrode in which an output signal is generated, an insulation column, a plurality of electrode layers for receiving an electrical signal from at least one circuit, and a phase change layer which is divided into at least two parts by the insulation column and is in contact with at least two side surfaces of the insulation column, and the phase change layer is phase-changed by the plurality of electrode layers.

The at least two parts of the phase change layer are connected to each other in an area under the insulation area.

The phase change layer included in each of the soma device and the synapse devices is formed of a chalcogenide.

The phase change layer included in the soma device is crystallized based on the output signal of each of the synapse devices, which is received through each of the electrode layers included in the soma device.

The crystallized phase change layer generates the output signal to the second electrode included in the soma device in response to the clock signal applied thereto through the first electrode included in the soma device.

The electrode layers are connected to the phase change layer in a vertical direction to have the three-dimensional structure.

The phase change layer included in each of the synapse devices is crystallized based on the electrical signal received through each of the electrode layers included in each of the synapse devices.

The crystallized phase change layer generates the output signal to the second electrode included in each of the synapse devices in response to the clock signal applied thereto through the first electrode included in each of the synapse devices.

A method for manufacturing an artificial neuron semiconductor device includes alternately depositing an insulating material and a metal conductive material to form a plurality of electrode layers receiving an electrical signal from at least one synapse circuit and an inter-insulating layer, patterning the insulating material and the metal conductive material, forming a phase change layer phase-changed by the electrode layers in an area in which the insulating material and the metal conductive material are patterned using a phase change material, forming an insulation column using the insulating material on a surface of the phase change layer, and depositing the metal conductive material on the insulation column to form a first electrode to which a clock signal is applied and a second electrode in which an electrical signal is generate. The forming the phase change layer using the phase change material includes forming the phase change layer such that the phase change layer is divided into at least two parts by the insulation column and is in contact with at least two side surfaces of the insulation column.

The forming the phase change layer using the phase change material includes forming the phase change layer such that the at least two parts of the phase change layer are connected to each other in an area under the insulation column.

The forming the phase change layer using the phase change material includes forming the phase change layer using a chalcogenide.

Other aspects, advantages, and salient features of the disclosure will become apparent to those skilled in the art from the following detailed description, which, taken in conjunction with the annexed drawings, discloses various embodiments of the present disclosure.

Advantageous Effects of the Invention

According to the embodiments of the present invention, the soma is modeled as the phase change layer, and the dendrites are modeled as the electrode layers connected to the phase change layer to have the three-dimensional structure. Accordingly, the artificial neuron semiconductor device having the three-dimensional structure that solves the problems of the power consumption and integration and the artificial neuron semiconductor system using the artificial neuron semiconductor device having the three-dimensional structure may be provided.

In particular, the artificial neuron semiconductor device having the three-dimensional structure, which is modeled on the neuron spiking as the crystallization process of the phase change layer formed of the chalcogenide, and the artificial neuron semiconductor system using the artificial neuron semiconductor device having the three dimensional structure may be provided.

BEST MODE

Hereinafter, embodiments of the present invention will be described in detail with reference to accompanying drawings. However, the present invention is not limited or restricted to the embodiments. In addition, same reference numerals in each drawing denote the same elements.

Figure 1:
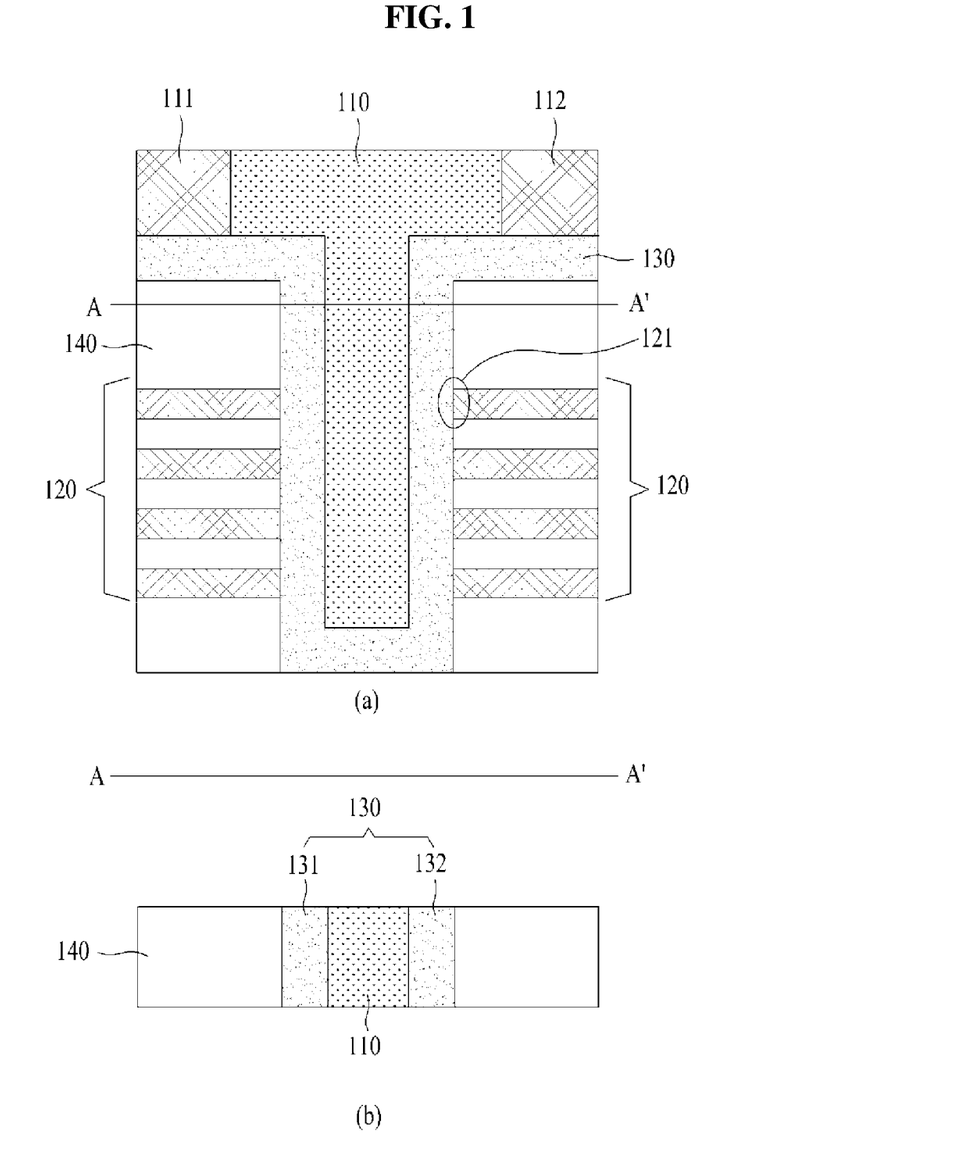
FIG. 1 is a view showing an artificial neuron semiconductor device having a three-dimensional structure according to an embodiment of the present invention.

FIG. 1 is a view showing an artificial neuron semiconductor device having a three-dimensional structure according to an embodiment of the present invention.

Referring to FIG. 1, the artificial neuron semiconductor device having the three-dimensional structure according to the embodiment of the present invention includes an insulation column 110, a plurality of electrode layers 120, and a phase change layer 130.

In the present embodiment, the insulation column 110 formed of an insulation material is connected to a first electrode 111 to which a clock signal is applied and a second electrode 112 in which an output signal is generated. For instance, the first electrode 111 and the second electrode 112 are formed of a metal conductive material. As shown in FIG. 1, the insulation column 110 has a T-shape, but the shape of the insulation column 110 should not be limited to the T-shape and may have various shapes.

The electrode layers 120 receive an electrical signal from at least one synapse circuit. In this case, the electrode layers 120 are connected to the phase change layer 130, which is described in detail below, in a vertical direction (each of the electrode layers 120 has a contact point 121 at which each of the electrode layers 120 is connected to the phase change layer 130 in the vertical direction), and thus the artificial neuron semiconductor device may have the three-dimensional structure. For instance, the electrode layers 120 are formed of the metal conductive material.

Accordingly, each of the electrode layers 120 connected to the phase change layer 130 in the vertical direction to have the three-dimensional structure may perform a function of dendrites that transmit the electrical signal selectively generated from the at least one synapse circuit to the phase change layer 130 that performs a function of a soma. The at least one synapse circuit will be described in detail with reference to FIGS. 2 and 3.

In this case, an inter-insulating layer 140 may be disposed between the electrode layers 120.

The phase change layer 130 is formed of a phase change material such that the phase change layer 130 is divided into at least two parts by the insulation column 110 and is in contact with two side surfaces of the insulation column 110, and the phase change layer 130 is phase-changed by the electrode layers 120. For instance, as shown in a top view of the artificial neuron semiconductor device having the three-dimensional structure, the phase change layer 130 may be divided into a first part 131 and a second part 132 by the insulation column 110 and may be in contact with at least two side surfaces of the insulation column 110.

In this case, the at least two parts of the phase change layer 130 may be connected to each other in an area under the insulation column 110.

Accordingly, the phase change material used to form the phase change layer 130 may be crystallized based on the electrical signal received through each of the electrode layers 120. Hereinafter, the term "crystallization of the phase change layer 130" may mean that the phase change layer 130 is changed to an amorphous state from a crystalline state or to the crystalline state from the amorphous state. In addition, the term "crystallization of the phase change layer 130" may mean not only that an entire area of the phase change layer 130 is crystallized but also that only a part of the phase change layer 130 is crystallized.

In particular, the phase change layer 130 may be formed of a chalcogenide that is crystallized based on the electrical signal. In this case, a degree in crystallization of the phase change layer 130 formed of the chalcogenide may be varied depending on an intensity of the electrical signal applied to the phase change layer 130. For instance, the phase change layer 130 formed of the chalcogenide may have eight different levels of crystallization degrees depending on the intensity of the electrical signal applied to the phase change layer 130. However, the phase change material used to form the phase change layer 130 should not be limited to the chalcogenide, and the phase change layer 130 may be formed of various materials with various crystallization degrees.

In the present embodiment, since a crystallization process of the phase change layer 130 formed of the chalcogenide is similar to a neuron spiking of a neuron network system, the phase change layer 130 may perform a function of the soma of the neuron network system.

As described above, the artificial neuron semiconductor device having the three-dimensional structure according to the embodiment of the present invention models the phase change layer 130 on the soma and models the electrode layers 120 connected to the phase change layer 130 in the three-dimensional structure on the dendrites, and thus the power consumption and the integration problem may be solved. In this case, the artificial neuron semiconductor device having the three-dimensional structure may model an operation in which the phase change layer 130 crystallized based on the electrical signal received through each of the electrode layers 120 generates an output signal to the second electrode 112 in response to a clock signal applied thereto via the first electrode 111 based on operations of the dendrites and the neuron in the neuron network system.

Figure 8A:
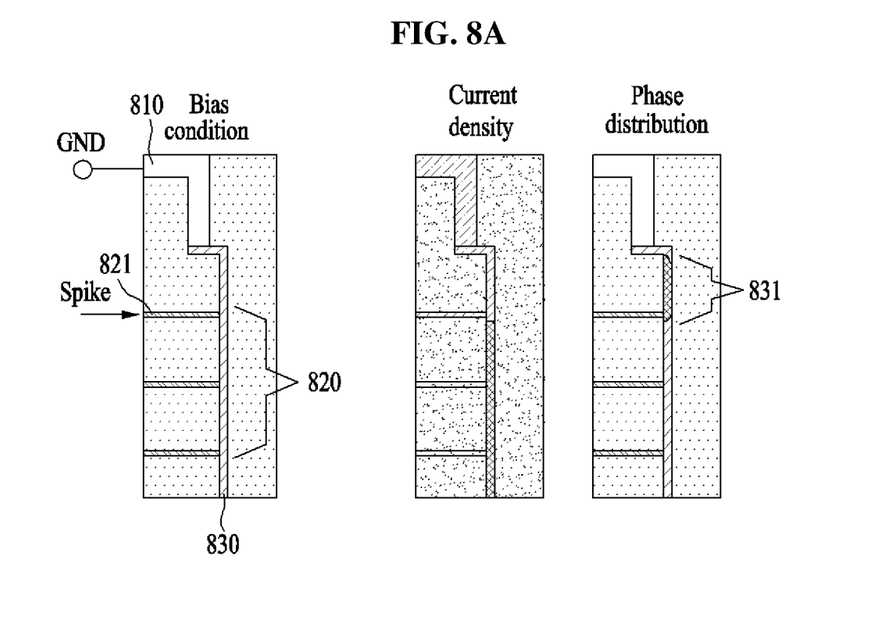
FIGS. 8A and 8B are views illustrating an operation of the artificial neuron semiconductor device having the three-dimensional structure.
Figure 8B:
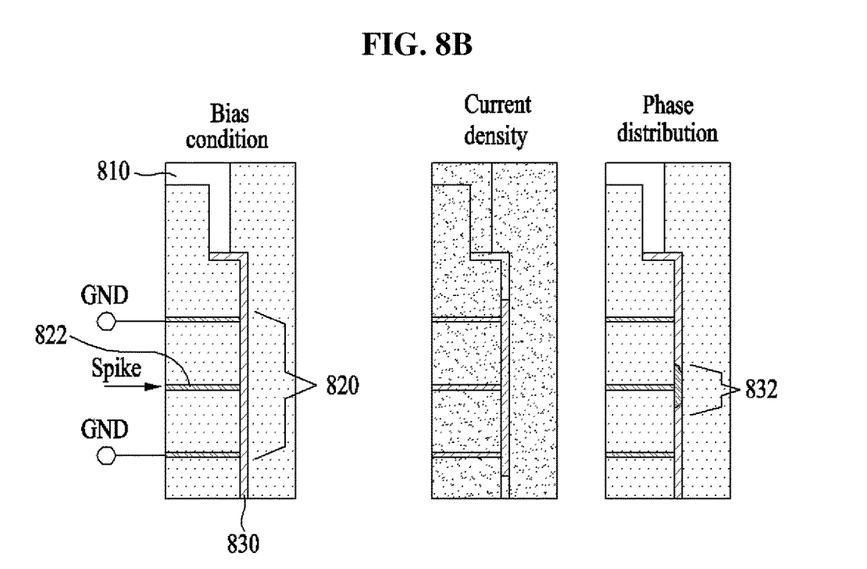

In detail, the artificial neuron semiconductor device having the three-dimensional structure according to the embodiment of the present invention may crystallize the phase change layer 130 in various manner based on spikes selectively generated by the electrode layers 120 (based on the electrical signal provided from each of the electrode layers 120) while the first electrode 111, the second electrode 112, and the electrode layers 120 are selectively grounded. Details on the above will be described with reference to FIG. 8.

Figure 2:
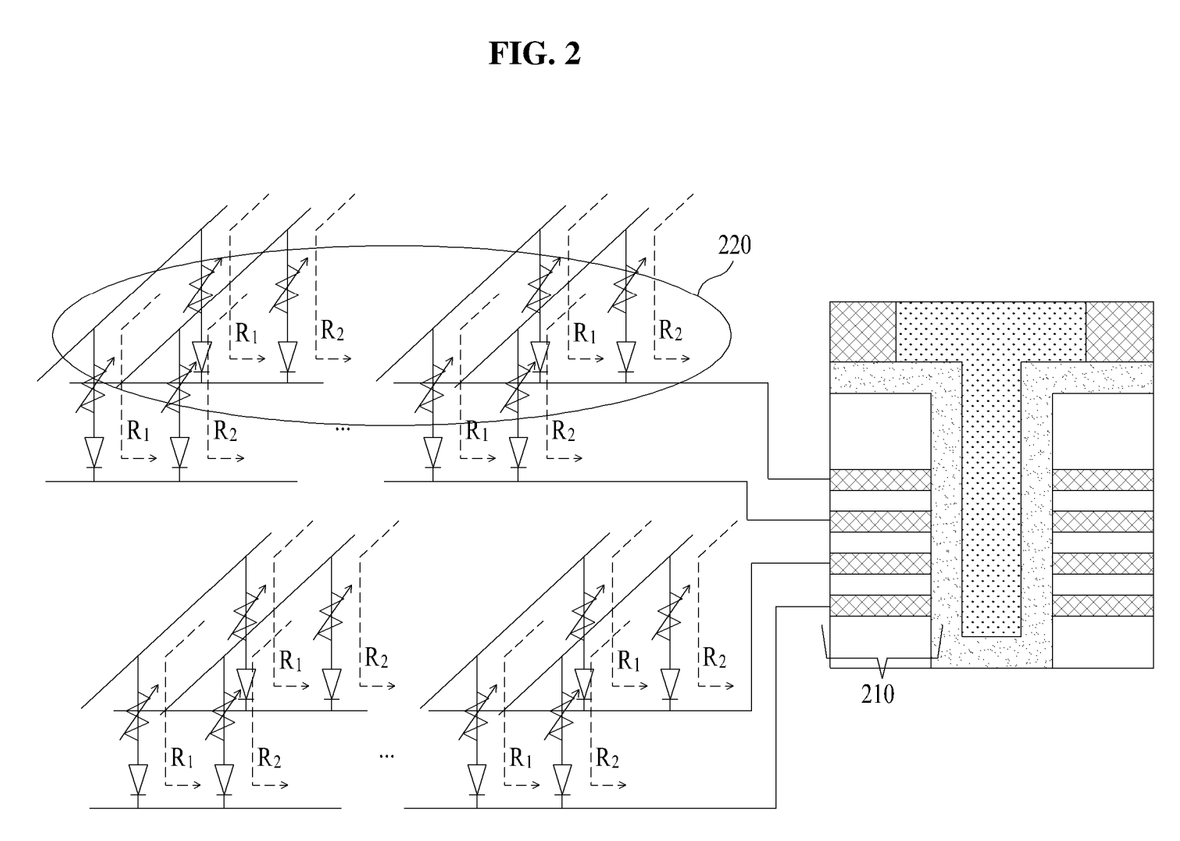
FIG. 2 is a view showing an artificial neuron semiconductor device having a three-dimensional structure and a synapse circuit connected to the artificial neuron semiconductor device having the three-dimensional structure according to an embodiment of the present invention.

FIG. 2 is a view showing an artificial neuron semiconductor device having a three-dimensional structure and a synapse circuit connected to the artificial neuron semiconductor device having the three-dimensional structure according to an embodiment of the present invention.

Referring to FIG. 2, each of electrode layers 210 included in the artificial neuron semiconductor device having the three-dimensional structure may be connected to at least one synapse circuit 220 that selectively generates the electrical signal.

In this case, since each of the electrode layers 210 included in the artificial neuron semiconductor device is connected in a vertical direction with respect to a phase change layer, the at least one synapse circuit connected to each of the electrode layers 210 may be easily integrated. Here, various circuits, e.g., a PCM, a RRAM, etc., may be used as the synapse circuit.

Figure 3:
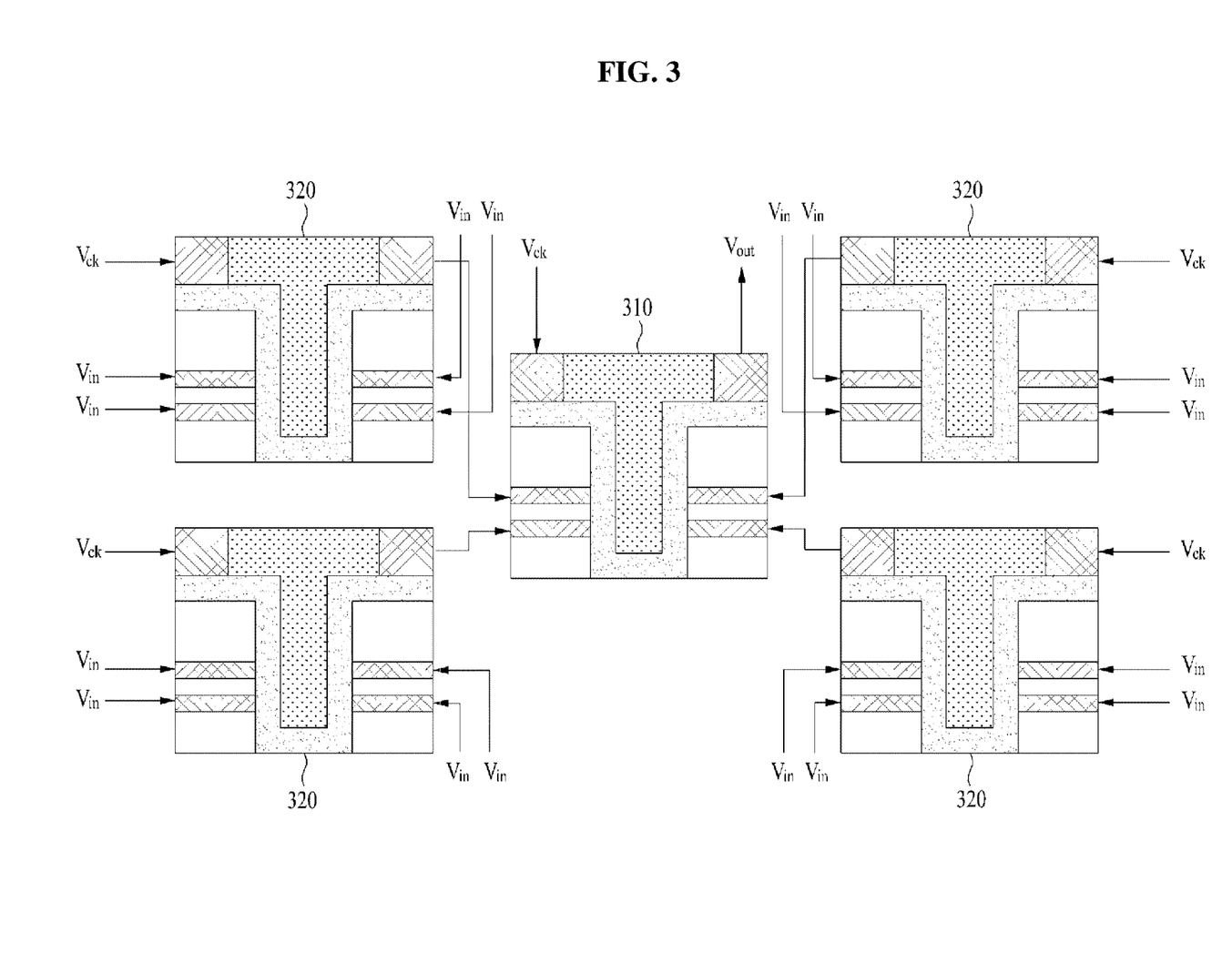
FIG. 3 is a view showing an artificial neuron semiconductor system having a three-dimensional structure according to an embodiment of the present invention.

FIG. 3 is a view showing an artificial neuron semiconductor system having a three-dimensional structure according to an embodiment of the present invention.

Referring to FIG. 3, the artificial neuron semiconductor system having the three-dimensional structure may use the above-described artificial neuron semiconductor device having the three-dimensional structure as a soma device and a synapse device.

In detail, the artificial neuron semiconductor system having the three-dimensional structure includes the soma device 310 and a plurality of synapse devices 320 connected to the soma device 310. In the present embodiment, each of the soma device 310 and the synapse devices 320 include a first electrode, a second electrode, an insulation column, a phase change layer, and a plurality of electrode layers as described with reference to FIG. 1. For instance, the phase change layer included in each of the soma device 310 and the synapse devices 320 may be formed of the chalcogenide having various crystallization degrees.

In this case, since the soma device 310 is connected to the second electrode of each of the synapse devices 320 via each of the electrode layers included in the soma device 310, the phase change layer included in the soma device 310 may be crystallized based on an output signal received through each of the electrode layers included in the soma device 310 from each of the synapse devices 320.

Accordingly, the crystallized phase change layer of the soma device 310 may generate the output signal to the second electrode included in the soma device 310 in response to a clock signal applied thereto via the first electrode included in the soma device 310.

Each of the synapse devices 320 is connected to a circuit, which selectively generates the electrical signal, via each of the electrode layers included in each of the synapse devices 320, and thus the phase change layer included in each of the synapse devices 320 may be crystallized based on the electrical signal received through each of the electrode layers included in each of the synapse devices 320.

Accordingly, the crystallized phase change layer of each of the synapse devices 320 may generate an output signal to the second electrode included in each of the synapse devices 320 in response to a clock signal applied thereto via the first electrode included in each of the synapse devices 320.

As describe above, the artificial neuron semiconductor system having the three-dimensional structure according to the embodiment of the present invention may model an operation in which the phase change layer of the soma device 310, which is crystallized based on the output signal from each of the synapse devices 320,generates an output signal to the second electrode of the soma device 310in response to a clock signal applied thereto via the first electrode of the soma device 310 based on operations of the dendrites and the neuron in the neuron network system.

In particular, since the operation of each of the synapse devices 320 is modeled on the operation of the synapse in the neuron network system, more diverse logic gates may be implemented than a case in which the PCM and RRAM are used as the synapse device. For instance, since the output signal of each of the synapse devices 320 is generated based on the crystallization degree of the phase change layer included in each of the synapse devices 320, more diverse output signals may be generated than the synapse device selectively generating the electrical signal as the PCM and RRAM, and the synapse device may be easily integrated.

Figure 4:
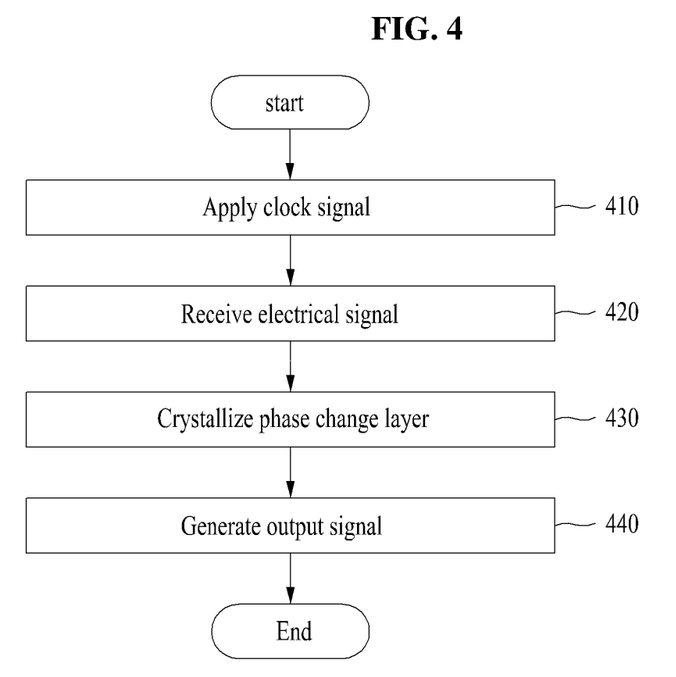
FIG. 4 is a flowchart showing a method for driving an artificial neuron semiconductor device having a three-dimensional structure according to an embodiment of the present invention.

FIG. 4 is a flowchart showing a method for driving an artificial neuron semiconductor device having a three-dimensional structure according to an embodiment of the present invention.

Referring to FIG. 4, the clock signal is applied to the first electrode connected to the insulation column of the artificial neuron semiconductor device having the three-dimensional structure according to the embodiment of the present invention (410).

Then, the electrical signal is received from the at least one synapse circuit through the electrode layers (420). In this case, the at least one synapse circuit selectively generating the electrical signal may be connected to each of the electrode layers.

After that, the phase change layer, which is divided into the at least two parts by the insulation column and is in contact with the two side surfaces of the insulation column, is crystallized based on the electrical signal received through each of the electrode layers (430). In this case, since the phase change layer is formed of the phase change material having various crystallization degrees such that the at least two parts divided by the insulation column are connected to each other in the area under the insulation column, the phase change may be caused by the electrode layers. For instance, the phase change layer may be formed of the chalcogenide.

Then, the crystallized phase change layer generates the output signal to the second electrode connected to the insulation column in response to the clock signal applied to the first electrode (440).

As described above, the method for driving the artificial neuron semiconductor device having the three-dimensional structure according to the embodiment of the present invention may be performed through the same process as the operations of the dendrites and the neuron in the neuron network system.

Figure 5:
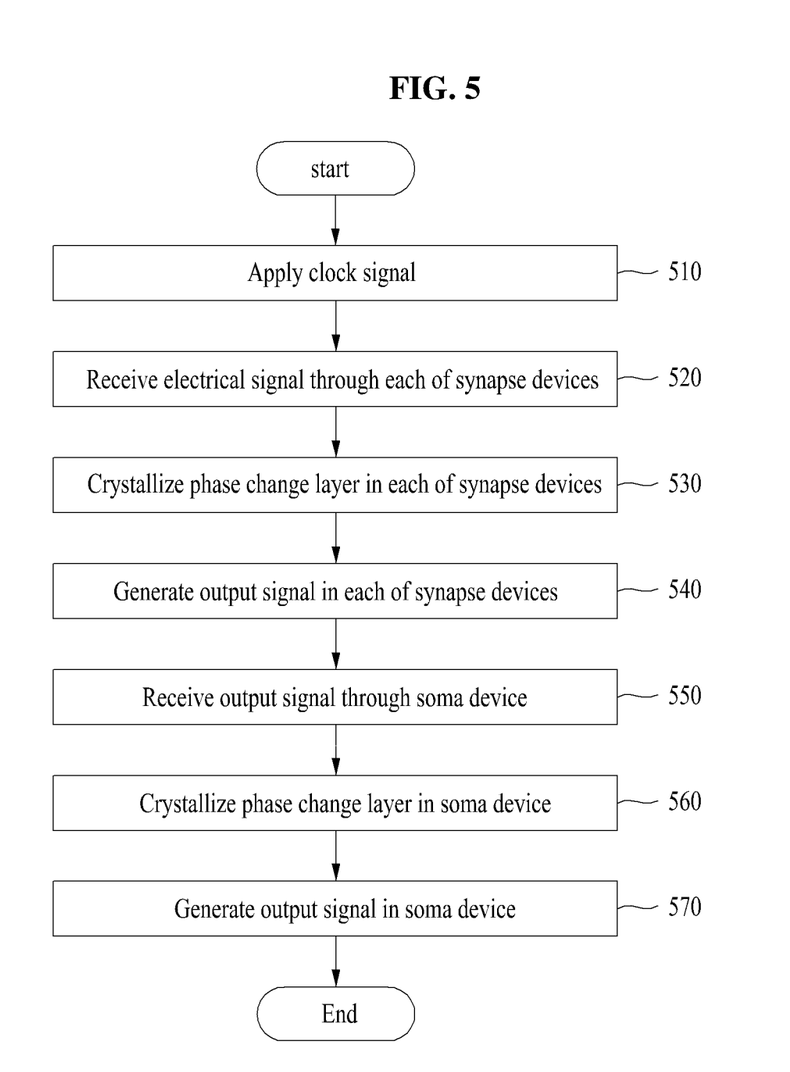
FIG. 5 is a flowchart showing a method for driving an artificial neuron semiconductor system having a three-dimensional structure according to an embodiment of the present invention.

FIG. 5 is a flowchart showing a method for driving an artificial neuron semiconductor system having a three-dimensional structure according to an embodiment of the present invention.

Referring to FIG. 5, the clock signal is applied to the first electrode connected to the insulation column of the soma device according to the embodiment of the present invention (510). In this case, the clock signal may be applied to the first electrode included in each of the synapse devices electrically connected to the soma device.

Then, the electrical signal is received from each of the synapse devices via each of the electrode layers (520). In this case, each of the electrode layers included in each of the synapse devices may be connected to the circuit that selectively generates the electrical signal.

Next, the phase change layer, which is divided into the at least two parts by the insulation column and is in contact with the two side surfaces of the insulation column, is crystallized based on the electrical signal received through each of the electrode layers in each of the synapse devices (530). In this case, since the phase change layer is formed of the phase change material having various crystallization degrees such that the at least two parts divided by the insulation column are connected to each other in the area under the insulation column, the phase change may be caused by the electrode layers. For instance, the phase change layer may be formed of the chalcogenide.

Then, the crystallized phase change layer generates the output signal to the second electrode connected to the insulation column in response to the clock signal applied to the first electrode in each of the synapse devices (540).

After that, the output signal is received from each of the synapse devices through each of the electrode layers of the soma device (550).

Next, the phase change layer, which is divided into the at least two parts by the insulation column and is in contact with the two side surfaces of the insulation column, is crystallized based on the output signal received through each of the electrode layers from each of the synapse devices in the soma device (560). In this case, since the phase change layer is formed of the phase change material having various crystallization degrees such that the at least two parts divided by the insulation column are connected to each other in an area under the insulation column, the phase change may be caused by the electrode layers. For instance, the phase change layer may be formed of the chalcogenide.

Then, the crystallized phase change layer generates the output signal to the second electrode connected to the insulation column in response to the clock signal applied to the first electrode in the soma device (570).

As described above, the method for driving the artificial neuron semiconductor system having the three-dimensional structure according to the embodiment of the present invention may be performed through the same process as the operations of the dendrites and the neuron in the neuron network system.

In particular, since the method for driving the artificial neuron semiconductor system having the three-dimensional structure is modeled using the above-described artificial neuron semiconductor device having the three-dimensional structure based on the operation of the synapse in the neuron network system, various logic gates may be implemented compared to a conventional artificial neuron semiconductor system.

Figure 6:
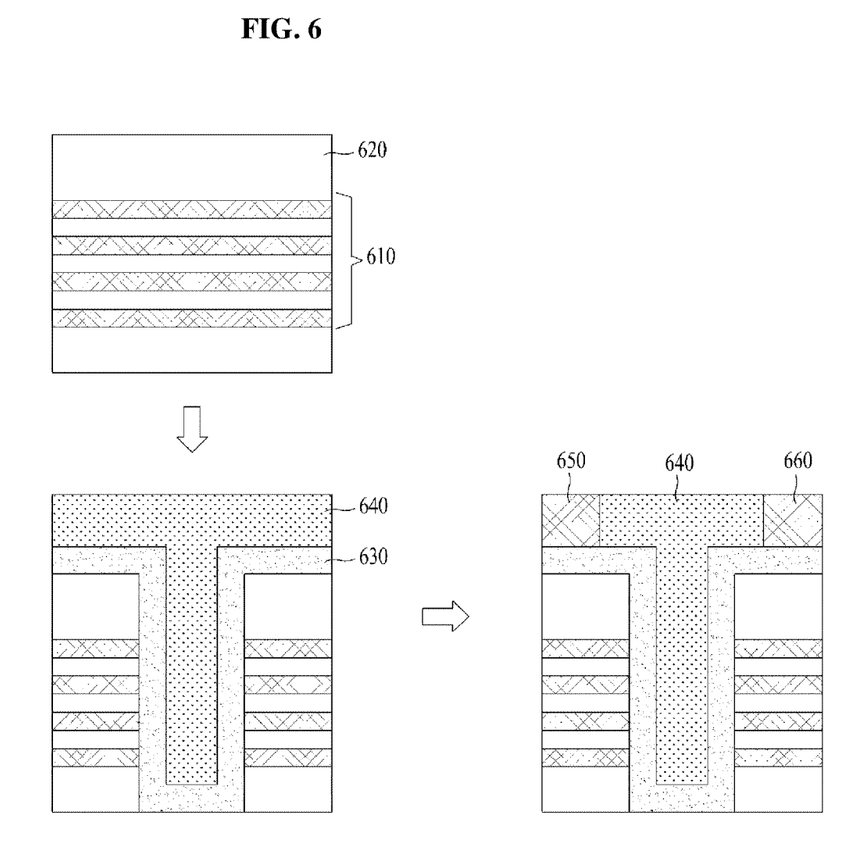
FIG. 6 is a flowchart showing a method for manufacturing an artificial neuron semiconductor device having a three-dimensional structure according to an embodiment of the present invention.

FIG. 6 is a flowchart showing a method for manufacturing an artificial neuron semiconductor device having a three-dimensional structure according to an embodiment of the present invention.

Referring to FIG. 6, according to a system for manufacturing the artificial neuron semiconductor device having a three-dimensional structure according to an embodiment of the present invention, an insulating material and a metal conductive material are alternately deposited to form a plurality of electrode layers 610 receiving an electrical signal from at least one synapse circuit and an inter-insulating layer 620.

Then, the manufacturing system for the artificial neuron semiconductor device patterns the insulating material and the metal conductive material and forms a phase change layer 630 that is phase-changed by the electrode layers 610 in the patterned area using a phase change material. In this case, the manufacturing system for the artificial neuron semiconductor device may form the phase change layer 630 using the phase change material having various crystallization degrees. For instance, the manufacturing system for the artificial neuron semiconductor device may form the phase change layer 630 using a chalcogenide.

After that, the manufacturing system for the artificial neuron semiconductor device forms an insulation column 640 on a surface of the phase change layer 630 using an insulating material. Here, the insulation column 640 is formed to have a T-shape by the manufacturing system for the artificial neuron semiconductor device, but the shape of the insulation column 640 should not be limited to the T-shape.

In this case, the manufacturing system for the artificial neuron semiconductor device forms the phase change layer 630 such that the phase change layer 630 is divided into at least two parts by the insulation column 640 and is in contact with at least two side surfaces of the insulation column 640. In addition, the manufacturing system for the artificial neuron semiconductor device may form the phase change layer 630 such that the at least two parts of the phase change layer 630 are connected to each other in an area under the insulation column 640.

Then, the manufacturing system for the artificial neuron semiconductor device deposits the metal conductive material on the insulation column 640 to form a first electrode to which a clock signal is applied and a second electrode 660 in which an output signal is generated. In this case, the manufacturing system for the artificial neuron semiconductor device may etch at least a portion of the insulation column 640 to allow the first electrode 650 and the second electrode 660 to be connected to the insulation column 640.

As described above, the manufacturing system for the artificial neuron semiconductor device according to the embodiment of the present invention forms the phase change layer 630 using the phase change material having various crystallization degrees, and thus the soma may be modeled. In addition, since the electrode layers 620 are connected to the phase change layer 630 to have the three-dimensional structure, the dendrites may be modeled.

Figure 7:
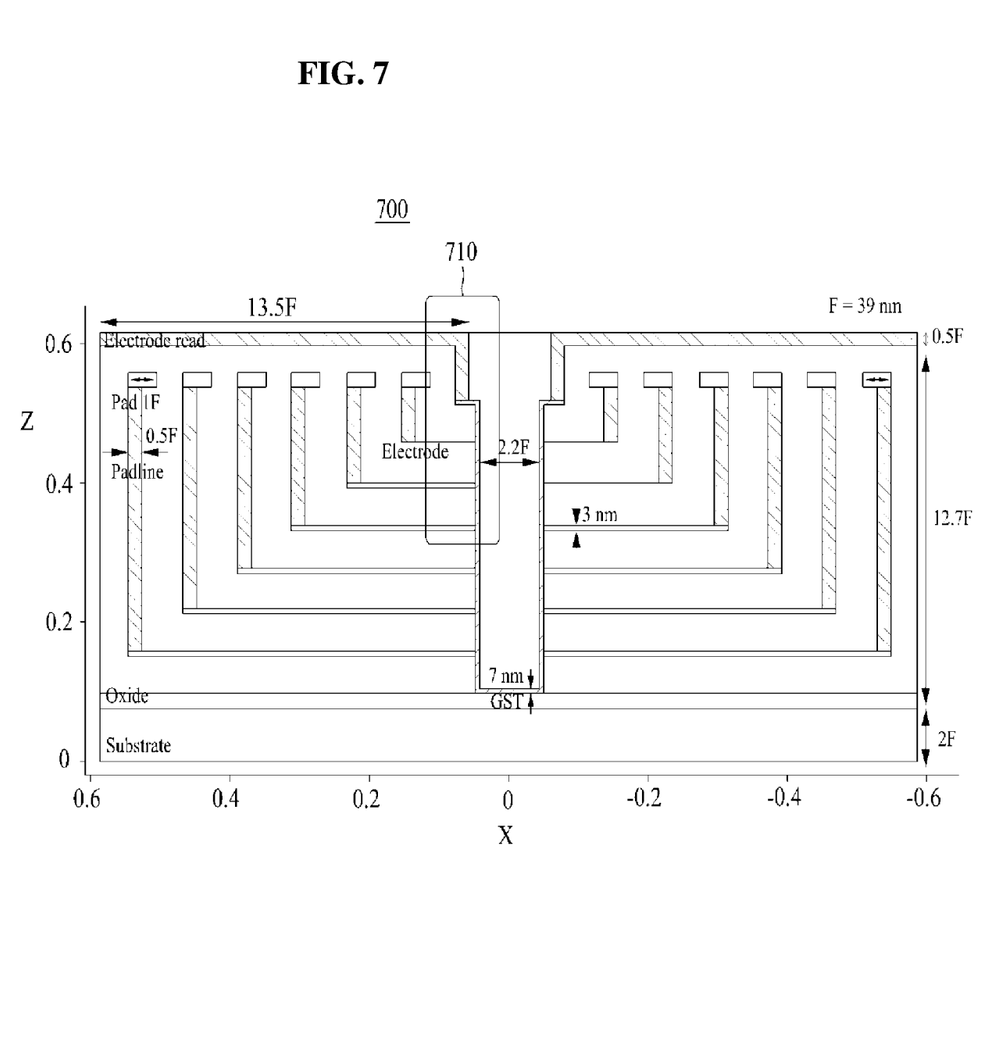
FIG. 7 is a view showing an implementation example of an artificial neuron semiconductor device having a three-dimensional structure according to an embodiment of the present invention.

FIG. 7 is a view showing an implementation example of an artificial neuron semiconductor device having a three-dimensional structure according to an embodiment of the present invention.

Referring to FIG. 7, an artificial neuron semiconductor device 700 having a three-dimensional structure described with reference to FIGS. 1 to 6 may be implemented as shown in FIG. 7. However, the structure of the artificial neuron semiconductor device should not be limited to that shown in FIG. 7, and the artificial neuron semiconductor device may have various structures based on the above-described structure.

FIGS. 8A and 8B are views illustrating an operation of the artificial neuron semiconductor device having the three-dimensional structure. In detail, FIGS. 8A and 8B are partially enlarged views of a portion 710 of the artificial neuron semiconductor device shown in FIG. 7 in order to illustrate an operation of the artificial neuron semiconductor device.

Referring to FIGS. 8A and 8B, the artificial neuron semiconductor device having the three-dimensional structure according to the embodiment of the present invention includes a first electrode and second electrode (e.g., a readout electrode) 810, a plurality of electrode layers 820, and a phase change layer 830 and selectively crystallizes the phase change layer 830 based on an electrical signal received through the first electrode and second electrode 810, and the electrode layers 820.

For instance, as shown in FIG. 8A, the artificial neuron semiconductor device may allow electrode layers except for a first electrode layer 821 among the electrode layers 820 to float since the readout electrode 810 is grounded and the electrical signal is received from the first electrode layer 821 among the electrode layers 820 (since a spike is generated from the first electrode layer 821 among the electrode layers 820). Accordingly, a remaining area of the phase change layer 830 excluding an area 831 corresponding to the first electrode layer 821 is maintained in a crystalline state, and only the area 831 of the phase change layer 830 corresponding to the first electrode layer 821 may be phase-changed to an amorphous state.

As another example, as shown in FIG. 8B, the artificial neuron semiconductor device may allow electrode layers except for a second electrode layer 822 among the electrode layers 820 and the readout electrode 810 to float since the electrode layers adjacent to the second electrode 822 among the electrode layers 820 are grounded and the electrical signal is received from the second electrode layer 822 among the electrode layers 820 (since a spike is generated from the second electrode layer 822 among the electrode layers 820). Accordingly, a remaining area of the phase change layer 830 excluding an area 832 corresponding to the second electrode layer 822 is maintained in a crystalline state, and only the area 832 of the phase change layer 830 corresponding to the second electrode layer 822 may be phase-changed to an amorphous state.

In the above descriptions, only a left portion of the artificial neuron semiconductor device shown in FIG. 7 has been explained with reference to the enlarged view of the left portion, and the above-described operation may be substantially simultaneously performed in a right portion of the artificial neuron semiconductor device.

INDUSTRIAL APPLICABILITY

While this disclosure includes specific examples, it will be apparent to one of ordinary skill in the art that various changes in form and details may be made in these examples without departing from the spirit and scope of the claims and their equivalents. Suitable results may be achieved if the described techniques are performed in a different order, and/or if components in a described system, architecture, device, or circuit area combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. An artificial neuron semiconductor device having a three-dimensional structure comprises:
    a first electrode to which a clock signal is applied;
    a second electrode in which an output signal is generated;
    an insulation column;
    a plurality of electrode layers for receiving an electrical signal from at least one synapse circuit; and
    a phase change layer which is divided into at least two parts by the insulation column and is in contact with at least two side surfaces of the insulation column, wherein the phase change layer is phase-changed by the plurality of electrode layers.

2. The artificial neuron semiconductor device having the three-dimensional structure of claim 1, wherein the at least two parts of the phase change layer are connected to each other in an area under the insulation column.

3. The artificial neuron semiconductor device having the three-dimensional structure of claim 1, wherein the phase change layer comprises a chalcogenide.

4. The artificial neuron semiconductor device having the three-dimensional structure of claim 1, wherein the phase change layer is crystallized based on the electrical signal received through each of the electrode layers.

5. The artificial neuron semiconductor device having the three-dimensional structure of claim 4, wherein the crystallized phase change layer generates the output signal to the second electrode in response to the clock signal applied thereto through the first electrode.

6. The artificial neuron semiconductor device having the three-dimensional structure of claim 1, wherein the electrode layers are connected to the phase change layer in a vertical direction to have the three-dimensional structure.

7. An artificial neuron semiconductor system having a three-dimensional structure comprises:
- a soma device; and
- a plurality of synapse devices connected to the soma device, each of the soma device and the synapse devices comprising:
  - a first electrode to which a clock signal is applied;
  - a second electrode in which an output signal is generated;
  - an insulation column;
  - a plurality of electrode layers for receiving an electrical signal from at least one circuit; and
  - a phase change layer which is divided into at least two parts by the insulation column and is in contact with at least two side surfaces of the insulation column, wherein the phase change layer is phase-changed by the plurality of electrode layers.

8. The artificial neuron semiconductor system having the three-dimensional structure of claim 7, wherein the at least two parts of the phase change layer are connected to each other in an area under the insulation area.

9. The artificial neuron semiconductor system having the three-dimensional structure of claim 7, wherein the phase change layer included in each of the soma device and the synapse devices comprises a chalcogenide.

10. The artificial neuron semiconductor system having the three-dimensional structure of claim 7, wherein the phase change layer included in the soma device is crystallized based on the output signal of each of the synapse devices, which is received through each of the electrode layers included in the soma device.

11. The artificial neuron semiconductor system having the three-dimensional structure of claim 10, wherein the crystallized phase change layer generates the output signal to the second electrode included in the soma device in response to the clock signal applied thereto through the first electrode included in the soma device.

12. The artificial neuron semiconductor system having the three-dimensional structure of claim 7, wherein the electrode layers are connected to the phase change layer in a vertical direction to have the three-dimensional structure.

13. The artificial neuron semiconductor system having the three-dimensional structure of claim 7, wherein the phase change layer included in each of the synapse devices is crystallized based on the electrical signal received through each of the electrode layers included in each of the synapse devices.

14. The artificial neuron semiconductor system having the three-dimensional structure of claim 13, wherein the crystallized phase change layer generates the output signal to the second electrode included in each of the synapse devices in response to the clock signal applied thereto through the first electrode included in each of the synapse devices.

* * * * *